US010263380B2

(12) United States Patent
Popovic

(10) Patent No.: US 10,263,380 B2
(45) Date of Patent: *Apr. 16, 2019

(54) CROSSTALK REDUCTION IN ELECTRICAL INTERCONNECTS

(71) Applicant: ORACLE INTERNATIONAL CORPORATION, Redwood City, CA (US)

(72) Inventor: Darko R. Popovic, San Diego, CA (US)

(73) Assignee: ORACLE INTERNATIONAL CORPORATION, Redwood City, CA (US)

(*) Notice: Subject to any disclaimer, the term of this patent is extended or adjusted under 35 U.S.C. 154(b) by 129 days.

This patent is subject to a terminal disclaimer.

(21) Appl. No.: 15/659,351

(22) Filed: Jul. 25, 2017

(65) Prior Publication Data
US 2017/0324208 A1 Nov. 9, 2017

Related U.S. Application Data

(62) Division of application No. 14/593,735, filed on Jan. 9, 2015, now Pat. No. 9,755,391.

(51) Int. Cl.
*H01R 43/20* (2006.01)
*H05K 1/02* (2006.01)
(Continued)

(52) U.S. Cl.
CPC ..... *H01R 43/205* (2013.01); *H01L 23/49816* (2013.01); *H01L 23/50* (2013.01);
(Continued)

(58) Field of Classification Search
CPC . H01R 43/205; H01L 23/50; H01L 23/49813; H01L 23/552; H01L 2924/14;
(Continued)

(56) References Cited

U.S. PATENT DOCUMENTS 7,232,959 B2   6/2007 Hsu
9,089,060 B1   7/2015 Azeraual
(Continued)

OTHER PUBLICATIONS

Noriyuki Miura, Daisuke Mizoguchi, Takayasu Sakurai and Tadahiro Kuroda, "Cross Talk Countermeasures in Inductive Inter-chip Wireless Superconnect", IEEE Apr. 2004 Custom Integrated Circuits Conference, 99 pages.

*Primary Examiner* — Sun J Lin
(74) *Attorney, Agent, or Firm* — Marsh Fischmann & Breyfogle LLP; Daniel J. Sherwinter; Kent A. Lembke

(57) ABSTRACT

Embodiments reduce crosstalk between electrical interconnects by offsetting pairs of electrical interconnects in an electrical system to produce a staggered interconnect pattern for which magnetic flux through a loop formed by a victim interconnect pair is effectively canceled. Magnetic field vectors generated by an aggressor pair of interconnects can pass through a loop-bounded surface defined by a victim pair of interconnects in the system. In the staggered interconnect pattern, the victim interconnect pair is offset with respect to the aggressor interconnect pair so that the field vectors passing through the victim pair's loop-bounded surface in one direction are substantially balanced by the field vectors passing through the victim pair's loop-bounded surface in the opposite direction, thereby minimizing the effect of the aggressor pair's magnetic field on the victim pair. Since crosstalk is proportional to the rate of change of the magnetic flux, reducing the magnetic flux can reduce the crosstalk.

10 Claims, 10 Drawing Sheets

(51) Int. Cl.
*H01L 23/498* (2006.01)
*H01L 23/50* (2006.01)
*H01L 23/552* (2006.01)

(52) U.S. Cl.
CPC ......... *H05K 1/0228* (2013.01); *H05K 1/0245* (2013.01); *H01L 23/552* (2013.01); *H01L 2924/14* (2013.01); *H01L 2924/15311* (2013.01); *H05K 2201/09609* (2013.01); *H05K 2201/09636* (2013.01)

(58) Field of Classification Search
CPC ........ H01L 2924/15311; H05K 1/0228; H05K 1/0245; H05K 2201/09609; H05K 2201/09636
USPC .................................................. 716/111, 115
See application file for complete search history.

(56) References Cited

U.S. PATENT DOCUMENTS 9,433,081 B1    8/2016   Xiong
9,755,391 B2*   9/2017   Popovic ............... H01R 43/205

* cited by examiner

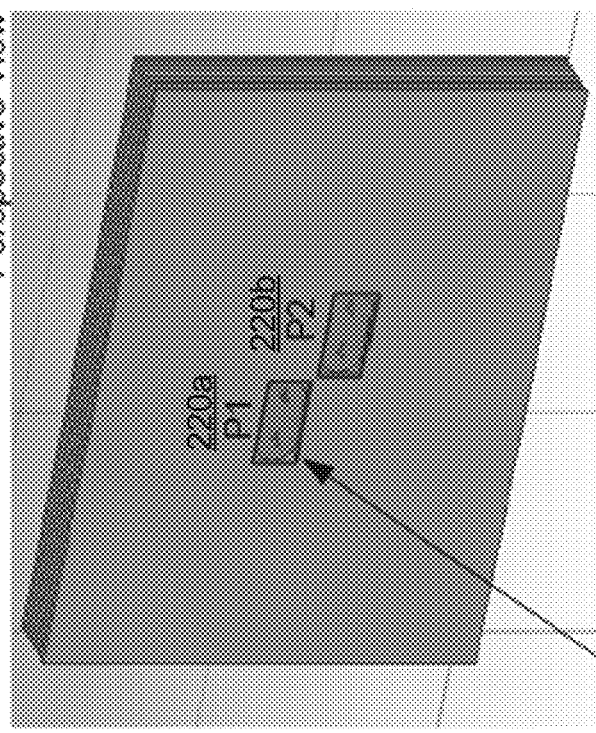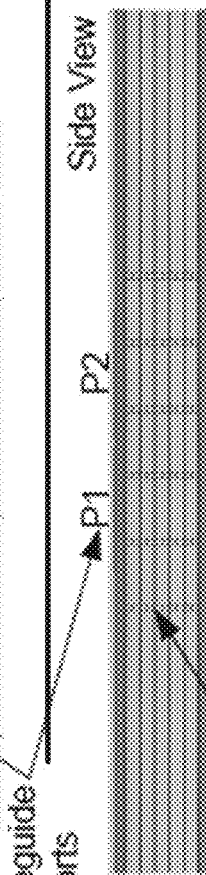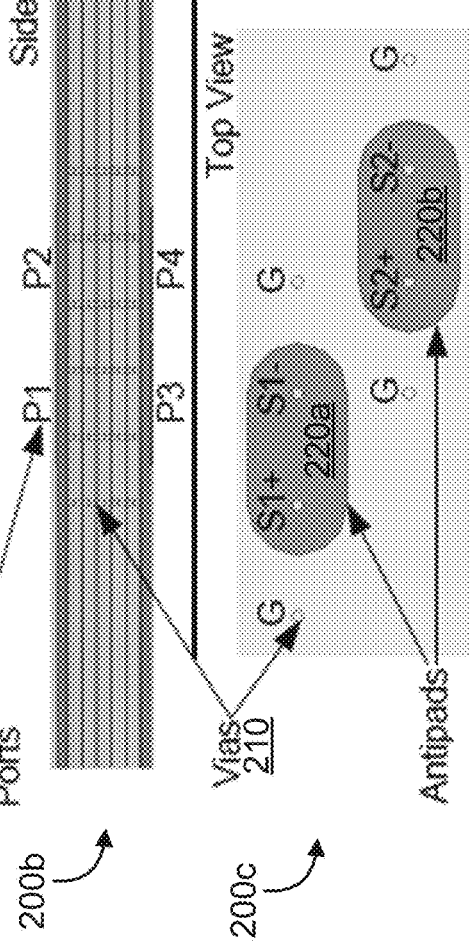

CROSSTALK REDUCTION IN ELECTRICAL INTERCONNECTS

RELATED APPLICATIONS

This application is a divisional of U.S. application Ser. No. 14/593,735, entitled "CROSSTALK REDUCTION IN ELECTRICAL INTERCONNECTS," and filed on Jan. 9, 2015, the entire contents of which are incorporated herein in its entirety as if set forth in full.

BACKGROUND

It is common for electrical systems to include various types of interconnects. For example, the interconnects can include input/output (I/O) pins, I/O bumps, ball grid array (BGA) elements, I/O vias, and/or other electrical structures implemented on packages for integrated circuits, printed circuit boards, electrical sockets, electrical connectors, electrical interposers and/or other types of electrical systems. In such structures, the conductors are often arranged in two-dimensional arrays in order to efficiently use the available area. As such, each interconnect is likely adjacent to multiple other interconnects.

An important factor in designing such structures is to control (e.g., minimize) crosstalk between the interconnects. For example, signals carried on one electrical interconnect can manifest as noise on other interconnects. The noise can become more pronounced (and potentially more detrimental to the efficacy of the electrical system) as data rates increase, voltage margins decrease, etc. For example, in many high-speed electrical systems, crosstalk can be strongest in structures, such as via arrays, connectors, and interfaces between packages and printed circuit boards (PCBs) (e.g., between BGAs and sockets).

One traditional approach to reducing crosstalk in these types of structures is to separate the interconnects as much as possible and/or to add return-path interconnects. The increased spacing can minimize inductive and/or similar effects (i.e., such effects typically drop off rapidly with distance), and surrounding signal interconnects with return-path interconnects can effectively provide shielding. However, both approaches can appreciably reduce the number of interconnects that can fit in a particular area, thereby potentially reducing signal density, increasing cost, etc. Some other traditional approaches include carefully assigning particular signals to particular interconnects to effectively separate likely interfering signals, or reorienting interconnects away from a two-dimensional array formation to increase spacing, shielding, etc. These other traditional approaches typically increase complexity of signal routing and design, and can often be incompatible with other standard methodologies.

BRIEF SUMMARY

Among other things, systems and methods are described for reducing crosstalk between electrical interconnects. Embodiments offset pairs of electrical interconnects in an electrical system to produce a staggered interconnect pattern for which the magnetic flux through a loop formed by a victim interconnect pair is effectively canceled. For example, each pair of interconnects (e.g., disposed to carry a pair of differential signals, a signal and return path, etc.) can be considered as manifesting a signal loop that effectively defines a closed contour, which bounds a surface (a "loop-bounded surface"). When an "aggressor" pair of interconnects carries its signal, a magnetic field is generated, which forms field vectors around the aggressor pair of interconnects. Those field vectors pass through the loop-bounded surfaces defined by the other ("victim") interconnect pairs in the system. In the staggered interconnect pattern, a victim interconnect pair is offset with respect to the aggressor interconnect pair so that the field vectors passing through the victim pair's loop-bounded surface in one direction are substantially balanced by the field vectors passing through the victim pair's loop-bounded surface in the opposite direction. Accordingly, the integral of the aggressor magnetic flux density over the victim loop-bounded surface (i.e., the magnetic flux) can be substantially zero. Since crosstalk is proportional to the rate of change of the magnetic flux, reducing the magnetic flux can reduce the crosstalk.

According to one set of embodiments, an electrical system is provided. The system includes: a package structure; a first pair of electrical interconnects integrated with the package structure to carry first complementary signals; and a second pair of electrical interconnects integrated with the package structure to carry second complementary signals. The second pair is positioned so that a first axis passing through the first pair is parallel to and non-co-linear with a second axis passing through the second pair, the first pair defines a magnetic field when carrying the first complementary signals, the second pair defines a loop-bounded surface when carrying the second complementary signals, and the second pair is offset from the first pair along the second axis to a location that minimizes a surface integral of magnetic flux density through the loop-bounded surface (i.e. magnetic flux).

According to another set of embodiments, a method is provided. The method includes: first integrating a first pair of electrical interconnects with a package structure to carry first complementary signals; calculating a location for a second pair of electrical interconnects, such that: a first axis passing through the first pair is parallel to and non-collinear with a second axis passing through the second pair, the location offsets the second pair from the first pair along the second axis by an amount that minimizes an integral of magnetic flux of a magnetic field over a loop-bounded surface, wherein the first pair defines the magnetic field when carrying the first complementary signals, and the second pair defines the loop-bounded surface when carrying second complementary signals; and second integrating, at the calculated location, a second pair of electrical interconnects with the package structure to carry the second complementary signals.

BRIEF DESCRIPTION OF THE DRAWINGS

The present disclosure is described in conjunction with the appended figures:

FIGS. 2A-2C show perspective, side, and top views, respectively, of another illustrative electrical system, for added context;

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
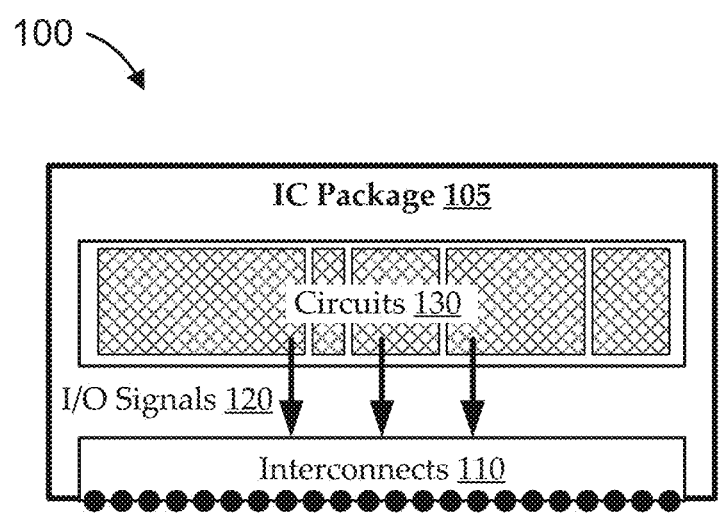
FIG. 1 shows a simplified view of an illustrative electrical system for the sake of context.

For the sake of context, FIG. 1 shows a simplified view of an illustrative electrical system 100. The system 100 is illustrated as an integrated circuit (IC) system that includes a number of circuits 130. Various ones of the circuits 130 can transmit and/or receive various types of signals, including I/O signals 120. The I/O signals 120 can be communicated between the circuits 130 of the IC and systems external to the IC (e.g., other circuits, etc.) via electrical interconnects 110. As used herein, the term "electrical interconnect" is intended to broadly refer to any suitable interconnect structure, including, for example, I/O pins, ball grid array (BGA) and/or other solder bumps, vias, etc. Further, while the system 100 of FIG. 1 is shown as an IC integrated into a package 105, embodiments generally apply to any suitable electrical system having such interconnects, including, for example, other forms of IC packages 105, printed circuit boards, electrical sockets, electrical connectors, electrical interposers, and/or any type of system that can experience crosstalk or other types of undesirable coupling between adjacent interconnects 110.

Increasing demands on electrical systems 100 have yielded IC designs with larger die sizes, larger numbers of circuits 130, more compaction of circuits 130, higher numbers and densities of I/O signals 120, etc. Such implementations typically force designers to integrate increasing numbers of electrical interconnects 110 into electrical systems 100, typically at increasing densities. As the numbers and densities of electrical interconnects 110 increase, there can be more coupling effects between adjacent electrical interconnects 110. For example, each electrical interconnect 110 tends to experience more crosstalk from its neighbors. Such effects can also increase in magnitude and/or have a larger impact on performance when the electrical systems carry higher speed signals, have lower voltage margins, etc. Thus, while it is often desirable to operate electrical systems 100 with high signal integrity, such signal integrity can be difficult to achieve with large numbers of densely arranged electrical interconnects 110. For example, many I/O signals 120 can be communicated as differential signals (e.g., by pairs of pins), which can permit more tolerance from common mode types of noise by using receivers having good common-mode rejection properties. However, differential mode crosstalk from densely arranged electrical interconnects 110 cannot typically be rejected as such. Further, such effects can increase in magnitude and/or have a larger impact on performance when the electrical systems carry higher speed signals, have lower voltage margins, etc. (e.g., coupling noise typically increases with higher frequencies).

There are a number of traditional approaches to reducing coupling between adjacent electrical interconnects 110. One category of traditional approaches involves increasing spacing to reduce near-field coupling effects. For example, physical spacing can be increased (e.g., I/O pins or bumps can be spaced further apart or offset from each other) or signal spacing can be effectively increased (e.g., by carefully assigning signals to I/O pins or bumps in a manner that increases the spacing between potentially interfering I/O signals 120).

Another category of traditional approaches involves adding shielding. In such arrangements, each electrical interconnect 110 or set of electrical interconnects 110 that carries signals can be partially or completely surrounded by supply interconnects (e.g., electrical interconnects 110 assigned to any useful source or reference level, such as chassis ground, positive source voltage level, negative voltage source level, etc.). For example, each differential pair of electrical interconnects 110 can be surrounded by six supply interconnects. Such approaches provide shielding between the electrical interconnects 110, thereby reducing crosstalk. However, adding supply interconnects can be an undesirable approach, as it can tend to increase the number and density of electrical interconnects 110, which can limit the signal density of a particular design, increase complexity by forcing other design constraints, etc.

FIGS. 2A-2C show perspective, side, and top views, respectively, of another illustrative electrical system 200, for added context. As illustrated, the system 200 can include two pairs of interconnects (illustrated as vias 210) that pass through multiple substrate layers of an electrical system 200 and terminate on either side of the electrical system 200 in waveguide ports 220 (i.e., terminating in ports P1 and P2 on one side of the electrical system 200, and terminating in ports P3 and P4 on the opposite side of the electrical system 200, see FIG. 2B). As shown in FIG. 2C, the waveguide ports 220 can be arranged in rows of a grid, such that they are vertically and horizontally offset from each other. As further shown in FIG. 2C, the waveguide ports 220 can be surrounded by supply interconnects (e.g., shown as ground vias) for added shielding.

In such an arrangement, the vias 210 of each waveguide port 220 can experience crosstalk from the vias 210 of the other waveguide ports 220. For example, crosstalk between ports P1 and P2 (or P3 and P4) is typically referred to as "near-end crosstalk," or NEXT; and crosstalk between ports P1 and P4 (or P2 and P3) is typically referred to as "far-end crosstalk," or "FEXT." As described below, such NEXT and FEXT are largely caused when electromagnetic fields that form around electrical interconnects carrying a signal induce electromagnetic effects (e.g., current) in other electrical interconnects. Embodiments described herein determine and exploit optimal offsets between the electrical interconnects so as to minimize these field effects, thereby minimizing crosstalk between electrical interconnects. For example, the offset shown in FIGS. 2A-2C is intended for clarity of illustration, and is not intended to represent the types of offsets implemented by various novel embodiments described here.

Figure 3:
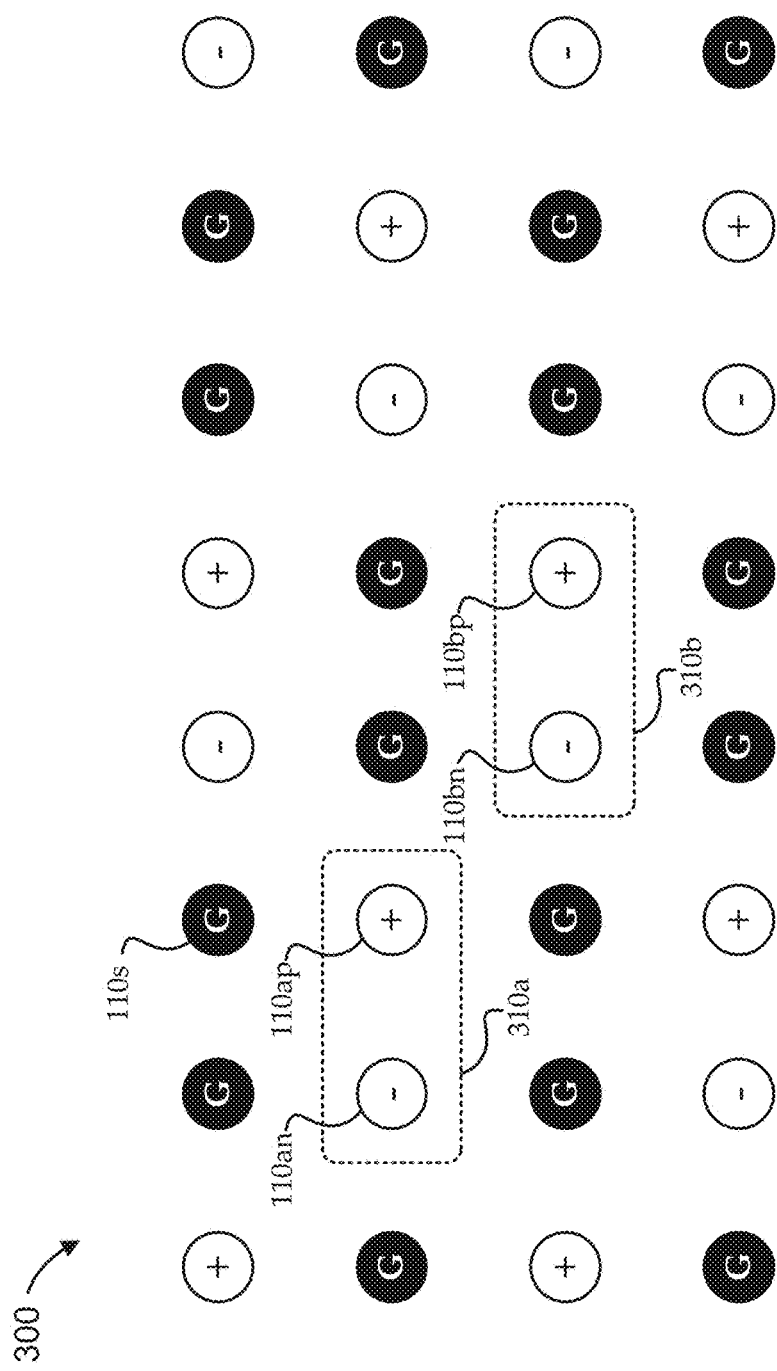
FIG. 3 shows a traditional array arrangement of interconnect pairs.

FIG. 3 shows a traditional array arrangement 300 of interconnect pairs 310. As illustrated, the arrangement 300 includes more than two pairs of electrical interconnects 110, each shown to include a positive interconnect and a negative interconnect. This is intended to generally convey that the interconnect pairs 310 can be implemented as a differential pair (i.e., for carrying differential signals), as a signal and return path, or as any other pair that can effectively manifest a signal loop, as described below. For example, a interconnect pair 310a is illustrated as formed by positive electrical interconnect 110ap and negative electrical interconnect 110an, and a second interconnect pair 310b is illustrated as formed by positive electrical interconnect 110bp and negative electrical interconnect 110bn; but each interconnect pair 310 can, alternatively, include one interconnect (e.g., 110ap, 110bp) configured as a signal path and another interconnect (e.g., 110an, 110bn) configured as a return path. Accordingly, reference herein to "complementary signals" is intended broadly to include any signals which, when carried by a respective interconnect pair 310, form a signal loop as described herein.

In the illustrated traditional arrangement 300, crosstalk is mitigated in at least two ways. First, the interconnect pairs 310 are offset both vertically and horizontally, by a relatively large amount, to reduce field effects. For example, if the distance between the interconnects (e.g., "pitch") is 1 millimeter, the vertical offset is illustrated as approximately 1 millimeter, and the horizontal offset is illustrated as approximately 2 millimeters. Second, as shown, the arrangement 300 can also include a number of source interconnects 110s (e.g., ground interconnects, etc.), arranged to surround the interconnect pairs 310 for added shielding and spacing. As discussed above, such arrangements have a number of limitations. For example, increased spacing between signal interconnects and large numbers of added non-signal interconnects (e.g., source interconnects) tend to appreciably reduce signal density (i.e., fewer signal interconnects can be packed into the same area).

Figure 4:
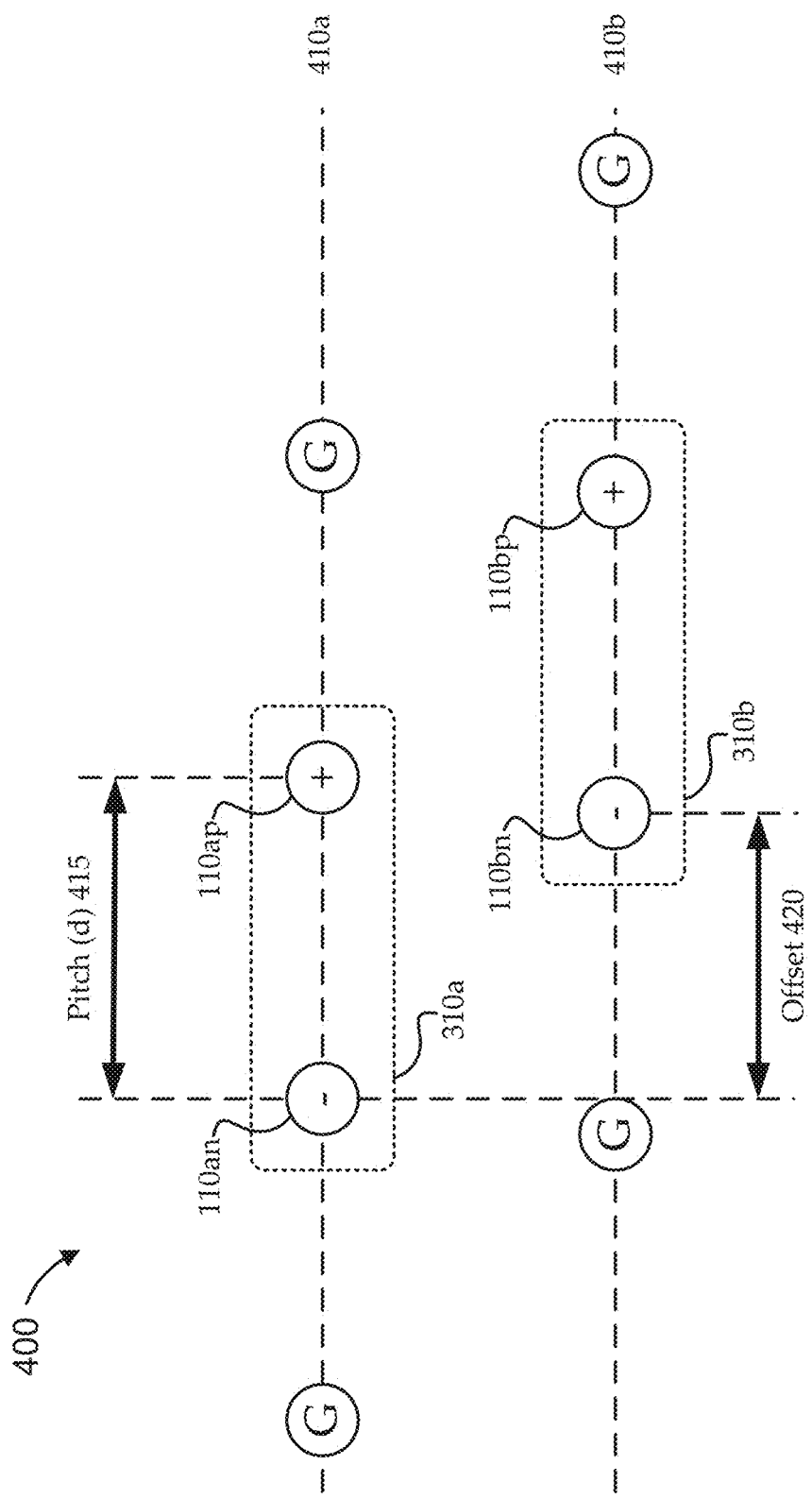
FIG. 4 shows a simplified diagram of a staggered array of electrical interconnects with optimal offset, according to various embodiments.

Embodiments seek to reduce crosstalk between electrical interconnects with a smaller impact to signal density and routability than that of traditional approaches. FIG. 4 shows a simplified diagram of a staggered array 400 of electrical interconnects 110 with optimal offset, according to various embodiments. The electrical interconnects 110 are shown as interconnect pairs 310. As described above, the interconnect pairs 310 can be implemented as differential pairs (i.e., for carrying differential signals), as signal and return paths, or as any other pairs that can effectively manifest respective signal loops. Each interconnect pair 310 is oriented on an axis 410, and each electrical interconnect 110 is separated from its neighbors on its axis 410 by a predefined pitch (d) 415. For example, the staggered array 400 can be designed according to an electrical system standard (e.g., an electrical connector standard, a BGA standard, an integrated circuit package standard, etc.), and the standard can define the pitch 415 and/or other aspects of the array 400.

Each axis 410 of the staggered array 400 effectively defined a row of the array 400, and each row can be shifted with respect to its adjacent rows by an offset 420. In the illustrated array 400, the offset 420 is smaller than the pitch 415 (e.g., approximately 0.85 d). As described herein, the offset is designed so that magnetic flux through a signal loop formed by a "victim" interconnect pair 310 is effectively canceled. For example, each interconnect pair 310 can be considered as manifesting a signal loop that effectively defines a loop-bounded surface. When an "aggressor" pair of interconnects (e.g., interconnect pair 310a) carries its signal, a magnetic field is generated, which forms field vectors around the aggressor pair of interconnects (e.g., around electrical interconnects 110ap and 110an). Those field vectors pass through the respective loop-bounded surfaces defined by the other interconnect pairs 310 in the system, so that those other interconnect pairs 310 become "victims" of the magnetic field generated by the aggressor. For example, in the illustrated array 400, interconnect pair 310b can be considered the most potentially affected victim of the field generated by interconnect pair 310a. However, as described more fully below, the offset 420 in the staggered array 400 is designed so that the field vectors from interconnect pair 310a that pass through the loop-bounded surface of interconnect pair 310b in one direction are substantially balanced by the field vectors from interconnect pair 310a passing through the loop-bounded surface of interconnect pair 310b in the opposite direction. Accordingly, the overall impact (e.g., the integral) of the aggressor magnetic field over the victim loop-bounded surface can be substantially zero. Since crosstalk is proportional to the rate of change of the magnetic flux, reducing the magnetic flux can reduce the crosstalk.

It is noted that, while the staggered array 400 is shown with only two interconnect pairs 310, any suitable number of interconnect pairs 310 can be included in the array 400. However, the magnitude of impact of an aggressor's field on any victim interconnect pair 310 decreases as the aggressor-victim distance increases. Accordingly, some embodiments focus design of the offset 420 on minimizing the impact of any aggressor on its nearest neighboring victim.

Figure 5:
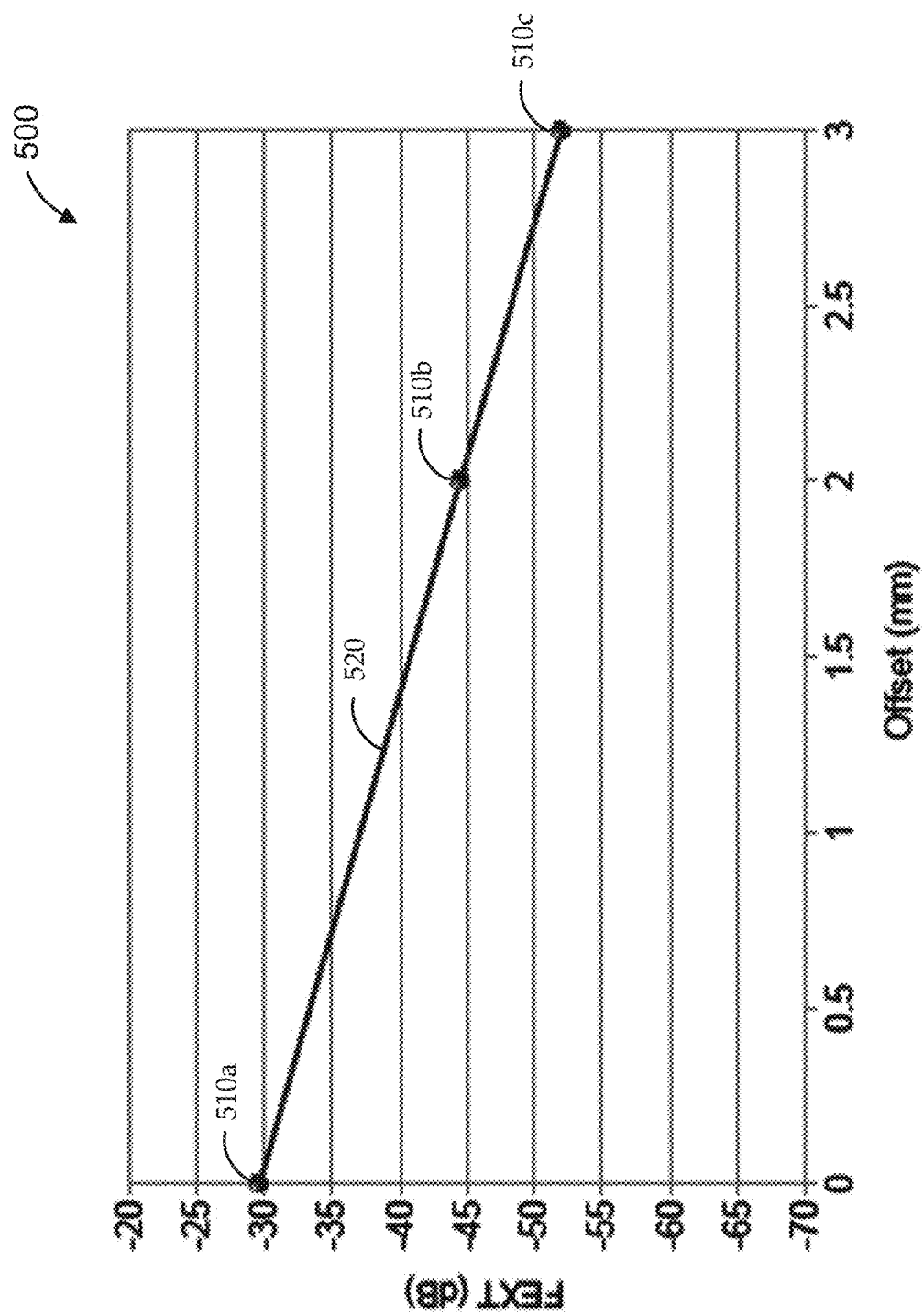
FIG. 5 shows a graph of initial simulation results to illustrate certain motivations of traditional approaches to crosstalk mitigation.

For the sake of illustration, a number of simulations were performed using a staggered array 400 implementation having a pitch 415 of 1 millimeter, a vertical offset (i.e., a separation between axes 410) of 1 millimeter, and different offsets 420. Results of those simulations are illustrated in FIGS. 5-8. Turning first to FIG. 5, a graph 500 of initial simulation results is shown to illustrate certain motivations of traditional approaches to crosstalk mitigation. The graph 500 plots far-end crosstalk (FEXT) versus offset for offset values of 0, 2, and 3 millimeters (shown as points 510a, 510b, and 510c). The result appears to demonstrate that FEXT decreases in a substantially linear fashion as offset increases (as illustrated by line 520). This suggests that a good way to reduce crosstalk is to offset, which motivates the common, traditional approach of adding separation between interconnects to mitigate crosstalk.

Figure 6:
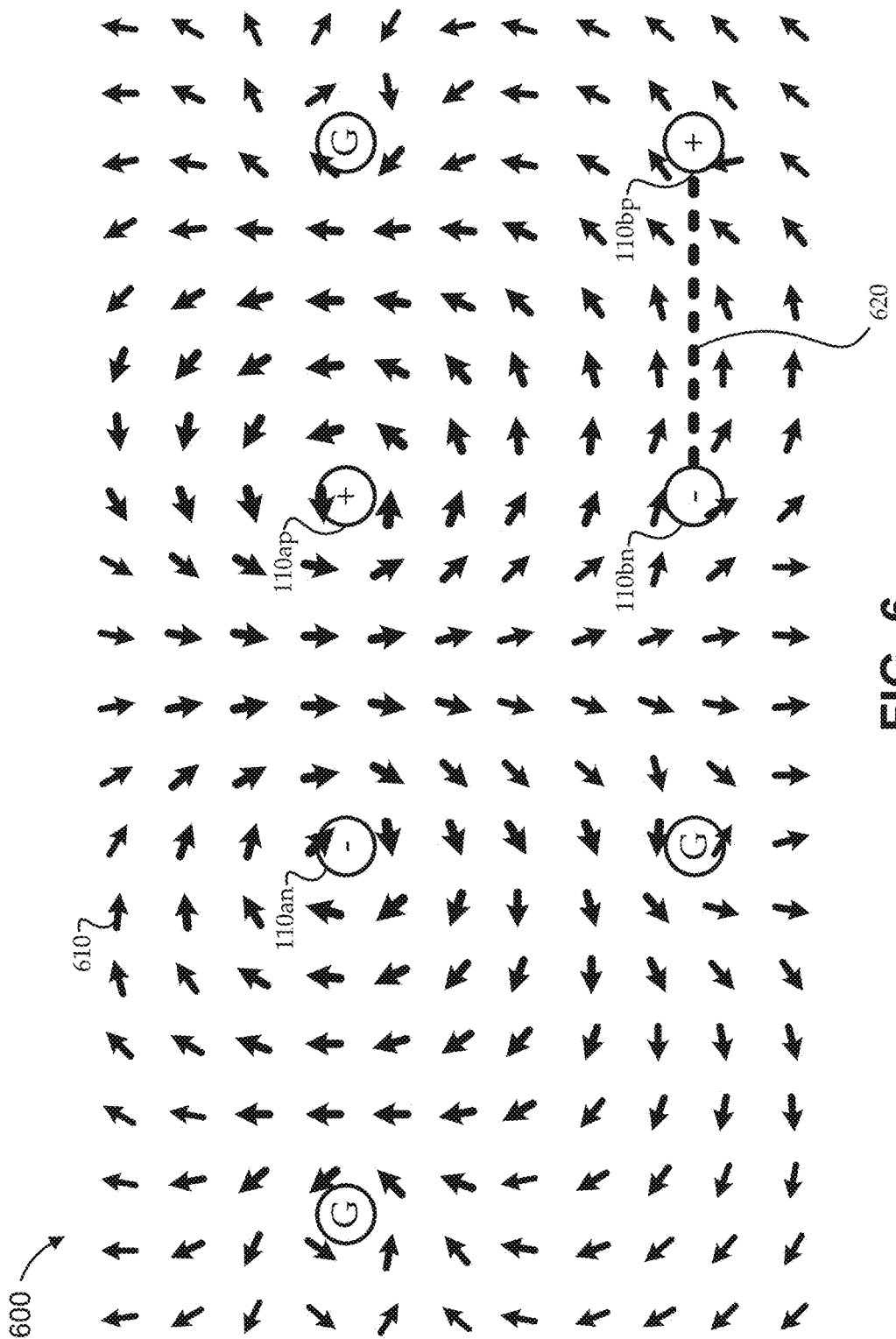
FIG. 6 shows an array having horizontal and vertical offsets of 1 millimeter between interconnect pairs, along with representative magnetic field vectors.

For added clarity, FIG. 6 shows an array 600 having horizontal and vertical offsets of 1 millimeter between interconnect pairs, along with representative magnetic field vectors 610. As illustrated, magnetic field vectors 610 form around electrical interconnects 110an and 110ap (for the sake of simplicity, only those field vectors generated by that pair of interconnects are shown). Each vector 610 of the aggressor field has an associated direction (shown by the arrow directions) and an associated magnitude (shown by the line weights), and those directions and magnitudes can define how the aggressor field influences each victim interconnect pair.

As described above, the signal loop associated with the victim interconnect pair that includes interconnects 110bn and 110bp effectively defines a loop-bounded surface. The loop-bounded surface is substantially normal to the illustrated field vectors 610 in the location illustrated by dashed line 620 (i.e., the effective surface boundary). Thus, the impact of the aggressor field on the victim interconnect pair can be a function of how the field vectors 610 cross the loop-bounded surface 620, for example, in different directions and magnitudes. For example, in the illustration of FIG. 6, the vectors in the vicinity of the loop-bounded surface 620 appear to have similar magnitudes, and more appear oriented upward than downward relative to the loop-bounded surface 620 (i.e., the integral of boundary crossings is imbalanced in an upward direction). Accordingly, the field vectors 610 are not balanced in that region, which can manifest as crosstalk between the aggressor and victim pairs.

Figure 7A:
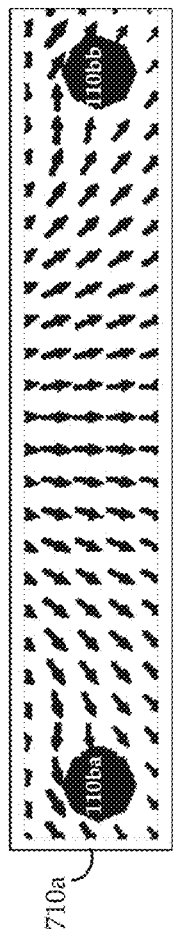
FIGS. 7A-7C further illustrate such effects over offsets of 0, 2, and 0.85 millimeters, respectively, for added clarity.
Figure 7B:
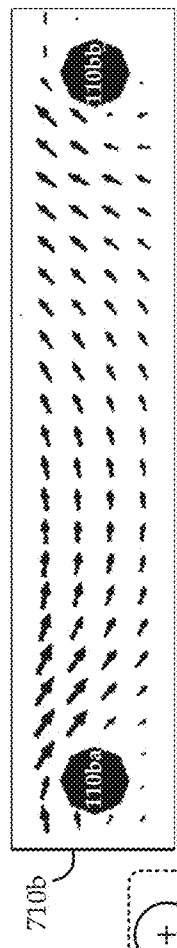
Figure 7C:
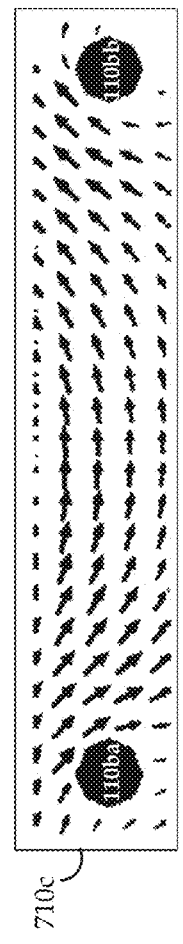

FIGS. 7A-7C further illustrate such effects over offsets of 0, 2, and 0.85 millimeters, respectively, for added clarity. The left side of FIG. 7A shows two interconnect pairs 310 having an offset 420a of zero millimeters. The right side of FIG. 7A shows a representation 710a of the magnitudes and directions of the field vectors generated by aggressor interconnect pair 310a in the vicinity of the loop-bounded surface of interconnect pair 310b. As shown, the vectors cross the loop-bounded surface between interconnects 110ba and 110bb overwhelmingly in a downward direction, which can manifest as appreciable crosstalk (e.g., as illustrated by point 510a in graph 500 of FIG. 5).

The left side of FIG. 7B shows two interconnect pairs 310 having an offset 420b of two millimeters. The right side of FIG. 7B shows a representation 710b of the magnitudes and directions of the field vectors generated by aggressor interconnect pair 310a in the vicinity of the loop-bounded surface of interconnect pair 310b. As shown, the vectors cross the loop-bounded surface between interconnects 110ba and 110bb in mostly an upward direction, though not as overwhelmingly as in FIG. 7A (and with smaller vector magnitudes). Accordingly, the resulting crosstalk in the two-millimeter offset 420b case is less than that in the zero-millimeter offset case, for example, as illustrated by point 510b in graph 500 of FIG. 5.

As discussed above, this result tracks the conventional motivation that increasing offset can decrease crosstalk. However, FIG. 7C reveals a result that is inconsistent with such conventional motivation. The left side of FIG. 7C shows two interconnect pairs 310 having an offset 420c of 0.85 millimeters. The right side of FIG. 7C shows a representation 710c of the magnitudes and directions of the field vectors generated by aggressor interconnect pair 310a in the vicinity of the loop-bounded surface of interconnect pair 310b. As shown, the vectors cross the loop-bounded surface between interconnects 110ba and 110bb in a substantially balanced manner (i.e., the same number and magnitude of vectors crosses the boundary in upward and downward directions). This can represent a substantial canceling of magnetic flux in the region and a minimization (or even elimination) of crosstalk from the aggressor interconnect pair 310a. Notably, this offset appears in a range of the graph 500 of FIG. 5 in which no data points 510 are shown.

Figure 8:
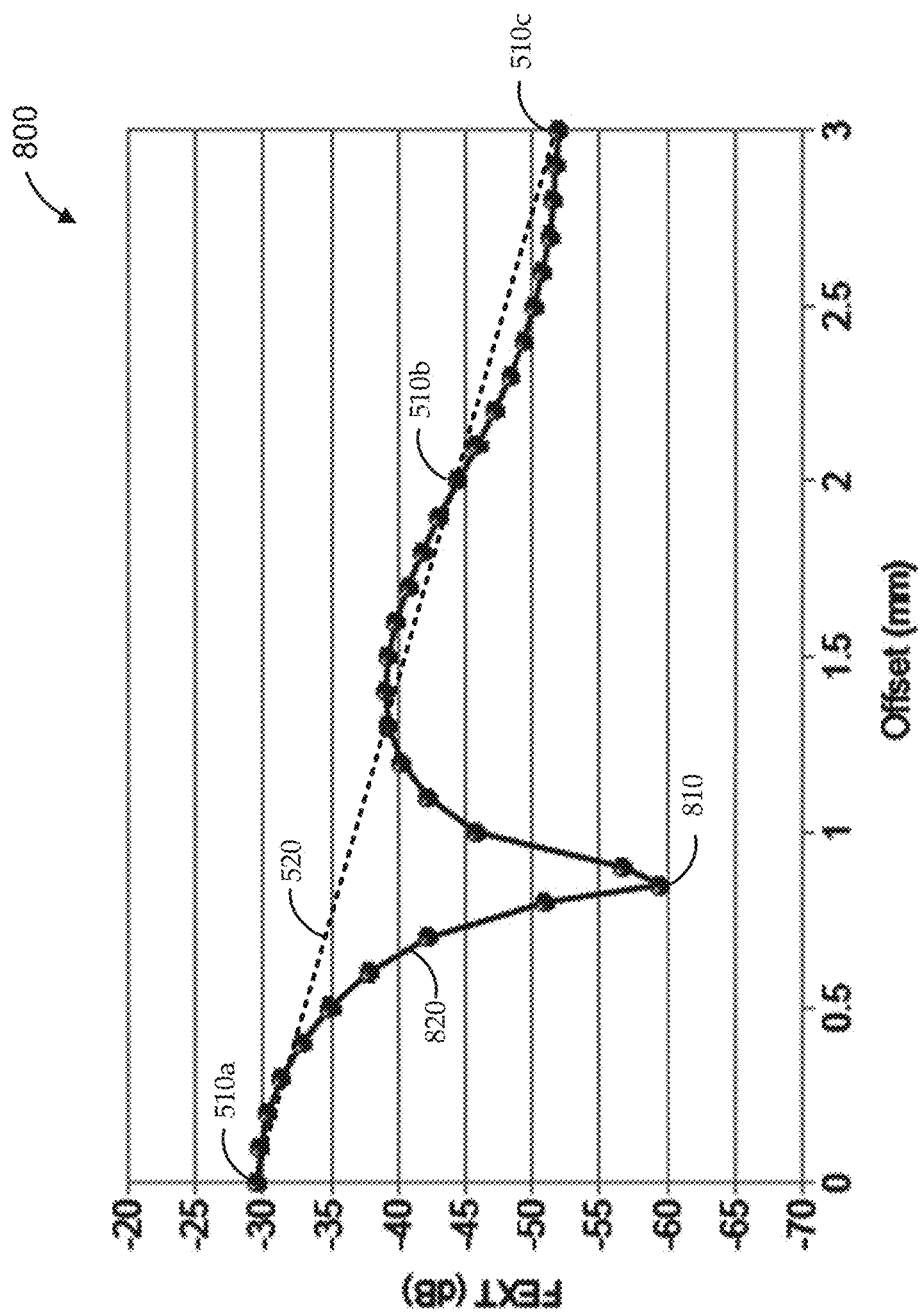
FIG. 8 shows another graph, similar to the graph of FIG. 5, but illustrating simulation results over a finer resolution of offsets.

FIG. 8 shows another graph 800, like the graph 500 of FIG. 5, illustrating simulation results over a finer resolution of offsets. The graph 800 plots far-end crosstalk (FEXT) versus offset for offset values between zero and three millimeters in 0.1-millimeter increments. For context, the graph 800 shows the data points 510 and trend line 520 from FIG. 5. In such a context and with more measurement resolution, it is clear that, in contrast to the conventional motivation illustrated by FIG. 5, the relationship between FEXT and offset is not linear. In fact, there is an appreciable drop in FEXT over a small range between around 0.5 and 1.0 millimeters, having a clear minimum FEXT at approximately 0.85 millimeters. This corresponds to the representation shown in FIG. 7C. The simulation results demonstrate that there is a region between about 0.85 millimeters and around 1.5 millimeters over which an increase in offset actually increases FEXT. This is a surprising result and runs counter to the traditional motivation discussed above.

Returning to the array 400 illustrated in FIG. 4, recognition that there is an offset that results in minimum crosstalk can optimize selection of offset 420. For example, the offset 420 can be set to a determined (e.g., calculated, measured, simulated, etc.) minimum, the offset 420 can be selected from among discrete suitable options according to the minimum, or the offset 420 can be impacted by the minimum in any other suitable manner. The precision of the minimization and/or the offset determination can be influenced by various practical factors, such as simulation or calculation resolution, manufacturing tolerances, acceptable ranges allowed by particular standards, etc.

Figure 9:
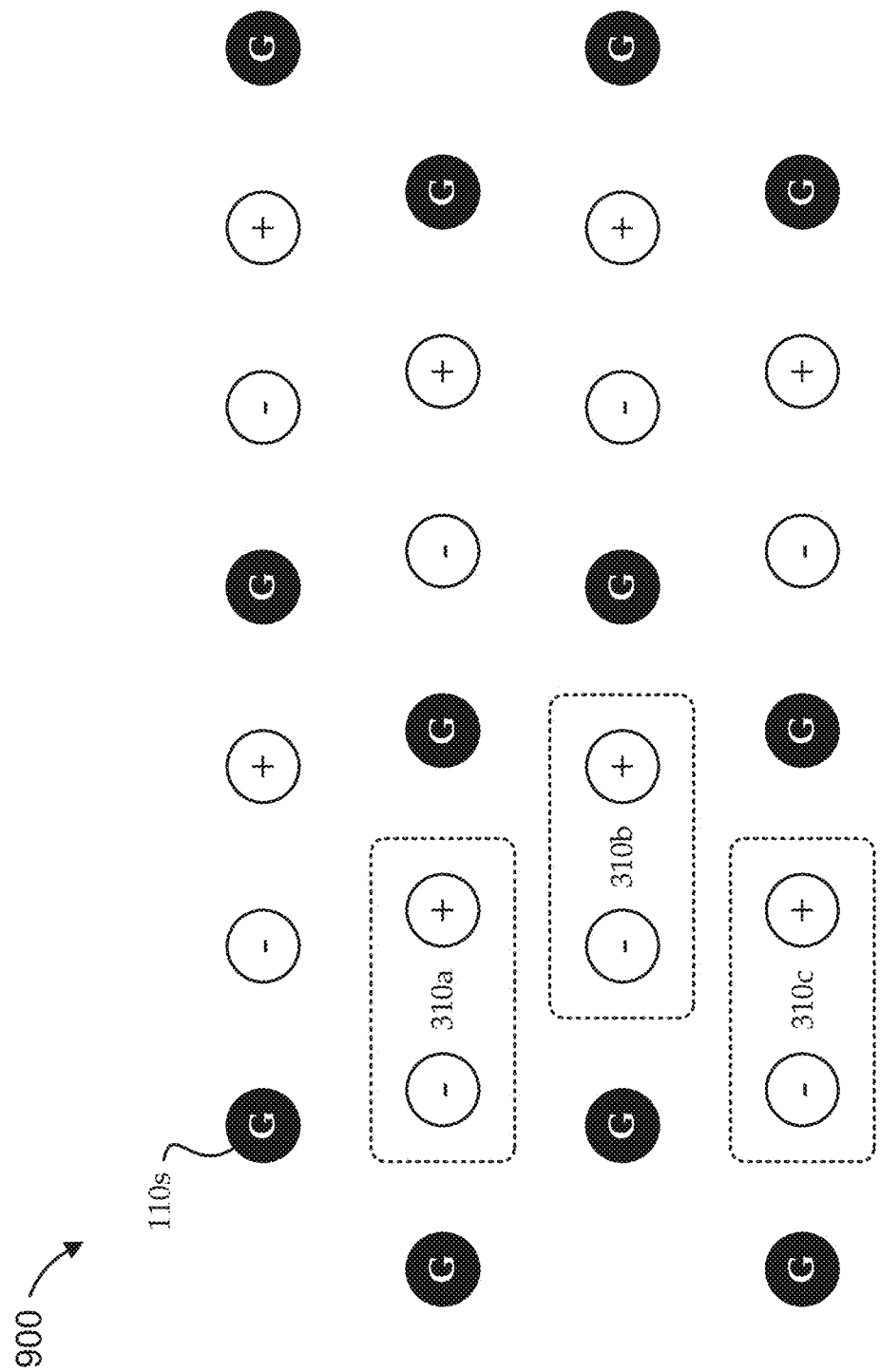
FIG. 9 shows a simplified diagram of a staggered array of electrical interconnects with optimal offset over more than two rows, according to various embodiments.

FIG. 9 shows a simplified diagram of a staggered array 900 of electrical interconnects 110 with optimal offset over more than two rows, according to various embodiments. For example, the array 900 is an expanded version of the array 400 shown in FIG. 4. As in FIG. 4, electrical interconnects are shown as interconnect pairs 310. Each interconnect pair 310 is flanked by source interconnects 110s, and each row is offset by an offset distance determined to result in minimum crosstalk (e.g., or is close to, or selected according to, such a determination) between each interconnect pair 310 and its nearest neighbor. For example, if interconnect pair 310a is used illustratively as the aggressor, all the other interconnect pairs 310 in the array would be victims of the aggressor's field. However, the impact of the aggressor's field on interconnect pair 310b would be greater than the impact on further separated interconnect pairs 310 (e.g., interconnect pair 310c). Accordingly, even optimizing the offset only with respect to interconnect pair 310b can have an appreciable mitigation effect on crosstalk across the electrical system. Similarly, if interconnect pair 310b is used illustratively as the aggressor, the impact of the aggressor's field would be greatest on interconnect pairs 310a and 310c, except that both are optimally offset from their aggressor pair.

Figure 10:
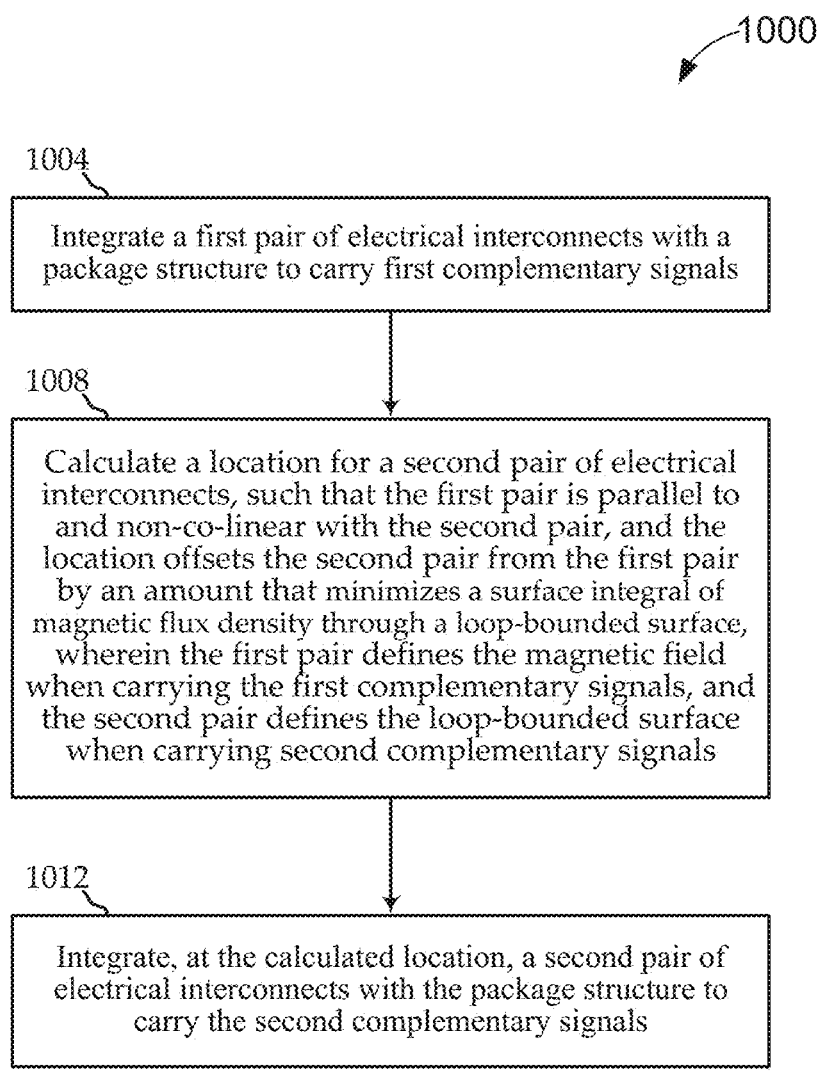
FIG. 10 shows a flow diagram of an illustrative method for reducing interference between electrical interconnects, according to various embodiments.

FIG. 10 shows a flow diagram of an illustrative method 1000 for reducing interference between electrical interconnects, according to various embodiments. Embodiments begin at stage 1004 by integrating a first pair of electrical interconnects with a package structure to carry first complementary signals. At stage 1008, a location can be calculated for a second pair of electrical interconnects. As described above, the location can be calculated, so that a first axis passing through the first pair is parallel to and non-co-linear with a second axis passing through the second pair, and so that the location offsets the second pair from the first pair along the second axis by an amount that minimizes magnetic flux (a surface integral of magnetic flux density through the loop-bounded surface). For example, the first pair is considered as an aggressor pair that defines the magnetic field when carrying the first complementary signals, and the second pair is considered as a victim pair that defines the loop-bounded surface when carrying second complementary signals. At stage 1012, a second pair of electrical interconnects can be integrated with the package structure at the calculated location to carry the second complementary signals. In some implementations, calculating the location involves simulating crosstalk between the first and second pairs over a plurality of candidate offsets and identifying the location as the candidate offset resulting in a minimum simulated crosstalk (or selecting the location as the best suitable option in accordance with the minimum simulated crosstalk).

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims. Notably, phrases (e.g., in the claims), such as "first integrating" and "second integrating," or the like, are intended to clarify those respective elements (e.g., to provide clear antecedent basis), and are not intended to imply or require any particular order.

The functions described may be implemented in hardware, software, firmware, or any combination thereof. If implemented in software, the functions may be stored as one or more instructions on a tangible computer-readable medium. A storage medium may be any available tangible medium that can be accessed by a computer. By way of example, and not limitation, such computer-readable media can comprise RAM, ROM, EEPROM, CD-ROM, or other optical disk storage, magnetic disk storage, or other magnetic storage devices, or any other tangible medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

A computer program product may perform certain operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Further, modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples. Even further, real world structures are described and claimed herein, and such structures are manufactured within real world (practical) tolerances, etc. Accordingly, terms such as "equidistant," "perpendicular," and the like are intended to be construed within their respective tolerances and contexts, as would be appreciated by one of skill in the art.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A method comprising:
   first integrating a first pair of electrical interconnects with a package structure to carry first complementary signals;
   calculating a location for a second pair of electrical interconnects, such that:
   a first axis passing through the first pair is parallel to and non-co-linear with a second axis passing through the second pair,
   the location offsets the second pair from the first pair along the second axis by an amount that minimizes an integral of magnetic flux density of a magnetic field over a loop-bounded surface, wherein the first pair defines the magnetic field when carrying the first complementary signals, and the second pair defines the loop-bounded surface when carrying second complementary signals; and
   second integrating, at the calculated location, a second pair of electrical interconnects with the package structure to carry the second complementary signals.

2. The method of claim 1, wherein:
   the first integrating comprises separating the first pair of electrical interconnects by a distance d; and
   the second integrating comprises offsetting the second pair from the first pair along the second axis by less than d.

3. The method of claim 2, wherein:
   the second integrating comprises offsetting the second pair from the first pair along the second axis by greater than 0.75 d.

4. The method of claim 1, wherein the first complementary signals are a pair of differential signals.

5. The method of claim 1, wherein one electrical interconnect of the first pair is a signal path, and another electrical interconnect of the first pair is a corresponding return path.

6. The method of claim 1, wherein:

the magnetic field comprises a plurality of vectors; and the second integrating comprises offsetting the second pair from the first pair along the second axis to the location that substantially balances between those of the plurality of vectors crossing the loop-bounded surface in a first direction, and those of the plurality of vectors crossing the loop-bounded surface in a second direction that is opposite the first direction.

7. The method of claim 1, wherein the calculating comprises:

simulating a crosstalk between the first pair and the second pair over a plurality of candidate offsets; and identifying the location as a candidate offset resulting in a minimum simulated crosstalk.

8. The method of claim 1, wherein the calculating comprises:

simulating a crosstalk between the first pair and the second pair over a plurality of candidate offsets; and selecting one of a plurality of manufacturable offset options closest to a candidate offset resulting in a minimum simulated crosstalk.

9. The method of claim 1, wherein each electrical interconnect of the first pair of electrical interconnects is at least one of an input/output (I/O) pin, an I/O bump, a ball grid array (BGA) element, or an I/O via.

10. The method of claim 1, wherein the package structure comprises at least one of an integrated circuit package, a printed circuit board, an electrical socket, an electrical connector, or an electrical interposer.

* * * * *